(12) United States Patent
Nakamura (10) Patent No.: US 7,342,053 B2
(45) Date of Patent: Mar. 11, 2008

(54) RESIN COMPOSITION, ADHESIVE FILM USING THE SAME AND MULTILAYER PRINTED CIRCUIT BOARD

(75) Inventor: Shigeo Nakamura, Kawasaki (JP)

(73) Assignee: Ajinomoto Co., Inc., Tokyo (JP)

( * ) Notice: Subject to any disclaimer, the term of this patent is extended or adjusted under 35 U.S.C. 154(b) by 316 days.

(21) Appl. No.: 11/044,060

(22) Filed: Jan. 28, 2005

(65) Prior Publication Data

US 2005/0187311 A1 Aug. 25, 2005

(30) Foreign Application Priority Data

Jan. 28, 2004 (JP) ............................. 2004-019923
Jun. 21, 2004 (JP) ............................. 2004-183138

(51) Int. Cl.
C08F 2/46 (2006.01)
C08F 12/36 (2006.01)
C09J 4/00 (2006.01)
H01L 21/00 (2006.01)
H01L 21/02 (2006.01)

(52) U.S. Cl. ...................... 522/174; 522/173; 522/181; 522/113; 522/116; 522/134; 522/135; 522/142; 522/151; 522/152; 156/90; 156/330; 156/327; 156/349; 156/379.6; 156/330.9; 156/331.3; 156/331.5; 156/331.7; 526/336; 526/335; 526/72; 438/118; 438/106

(58) Field of Classification Search ................ 522/151, 522/152, 173, 174, 181, 113, 116, 134, 135, 522/142; 438/118, 106; 156/90, 327, 349, 156/379.6, 330.9, 330, 331.3, 331.5, 331.7; 526/336, 335, 72
See application file for complete search history.

(56) References Cited

U.S. PATENT DOCUMENTS

| | | | | |
|---|---|---|---|---|
| 5,043,184 A | * | 8/1991 | Fujii et al. | 427/492 |
| 5,856,022 A | * | 1/1999 | McCormick et al. | 428/500 |
| 6,090,474 A | * | 7/2000 | Johansson et al. | 428/209 |
| 6,427,325 B1 | * | 8/2002 | Johansson et al. | 29/852 |
| 6,734,569 B2 | * | 5/2004 | Appelt et al. | 257/783 |
| 6,790,473 B2 | * | 9/2004 | Papathomas et al. | 427/96.1 |
| 6,794,040 B2 | * | 9/2004 | Johansson et al. | 428/413 |
| 2003/0064212 A1 | * | 4/2003 | Johansson et al. | 428/209 |
| 2005/0129895 A1 | * | 6/2005 | Nakamura | 428/40.1 |

FOREIGN PATENT DOCUMENTS

| | | |
|---|---|---|
| JP | 09-031006 | 2/1997 |
| JP | 2001-181383 | 7/2001 |
| JP | 2003-277440 | 10/2003 |
| JP | 2003-283076 | 10/2003 |
| WO | WO 02/083610 A1 | 10/2002 |
| WO | WO 03/099952 A1 | 12/2003 |

* cited by examiner

Primary Examiner—Sanza L. McClendon
(74) Attorney, Agent, or Firm—Oblon, Spivak, McClelland, Maier & Neustadt, P.C.

(57) ABSTRACT

Producing a printed circuit board, by coating a resin composition comprising an aromatic cyanate compound having two or more cyanato groups in a molecule and a radical-polymerizable resin on a circuit substrate, photo-curing the resin composition, and thermally curing the photo-cured resin composition to thereby form an insulation layer, affords an insulation layer with improved surface smoothness and excellent dielectric properties.

26 Claims, 2 Drawing Sheets

RESIN COMPOSITION, ADHESIVE FILM USING THE SAME AND MULTILAYER PRINTED CIRCUIT BOARD

CROSS REFERENCES TO RELATED APPLICATIONS

This application claims priority to Japanese Patent Application No. 019923/2004, filed on Jan. 28, 2004, and Japanese Patent Application No. 183138/2004, filed on Jun. 21, 2004, both of which are incorporated herein by reference in their entireties.

BACKGROUND OF THE INVENTION

1. Field of the Invention

The present invention relates to processes for producing a printed circuit board. The present invention further relates to resin compositions and adhesive films which are advantageously used in such a process.

2. Discussion of the Background

In recent years, for a printed circuit board used in electronic appliances, communications apparatus and the like, higher processing speeds and higher wiring densities have been strongly required. Accordingly, as a process for producing a multilayer printed circuit board, the production technique of a build-up system in which an organic insulation layer is alternately stacked on a conductor layer of a circuit substrate has attracted much interest. As an insulation resin currently used in the build-up system, aromatic epoxy resins in combination with curing agents having active hydrogen (for example, a phenolic curing agent, an amine-type curing agent, and a carboxylic acid-type curing agent) have been mainly used. The cured product obtained using these curing agents has well-balanced properties, but suffers from the defects that a hydroxyl group having a high polarity is generated by the reaction of an epoxy group and active hydrogen which decreases the moisture resistance and electrical properties such as the dielectric constant and the dielectric dissipation factor. Especially for a multilayer printed circuit board which is to be used in the high-frequency region, an insulation material having a low dielectric dissipation factor has been required. However, with an ordinary insulation material which contains an epoxy resin as a main component, the value of the dielectric dissipation factor (1 GHz, 23° C.) has been limited to from approximately 0.03 to 0.02.

Figure 1:
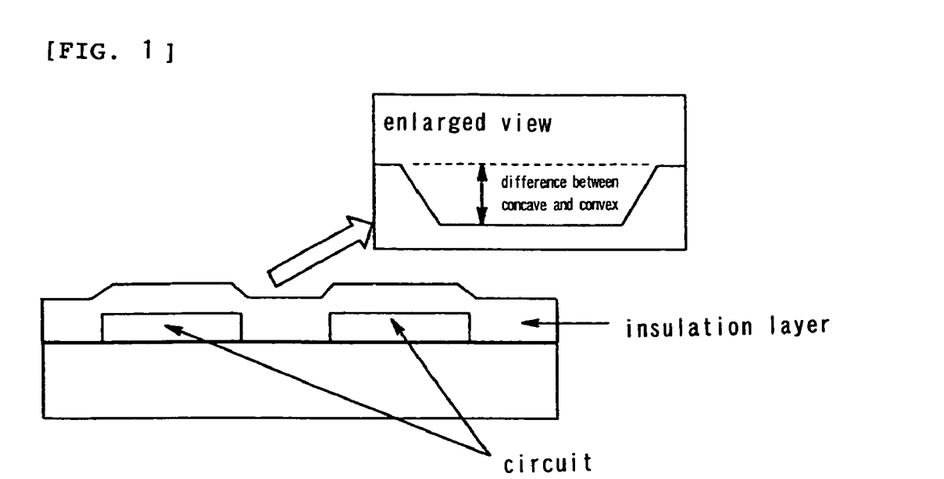
FIG. 1 is a conceptional view showing a concave-convex gap of an insulation layer formed on a circuit substrate.

Meanwhile, it has been long known that a cyanate compound having a thermosetting cyanato group gives a cured product with excellent dielectric properties, and an example of applying a thermosetting resin composition containing a cyanate compound to an insulation layer of a circuit substrate has been also known (see, for example, WO 03/099952). However, when an insulation layer is formed on a circuit substrate with a thermosetting resin composition which contains a cyanate compound, a concave-convex gap on the surface of the insulation layer ascribable to concave and convex surface of a circuit pattern has been increased, making it hard to form a fine circuit (see, FIG. 1). Accordingly, a thermosetting resin composition which contains a cyanate compound and which affords an insulation layer which exhibits an excellent flatness on its surface has been in demand.

SUMMARY OF THE INVENTION

Accordingly, it is one object of the present invention to provide novel resin compositions.

It is another object of the present invention to provide novel resin compositions which are useful for forming multilayer printed circuit boards.

It is another object of the present invention to provide novel adhesive films.

It is another object of the present invention to provide novel adhesive films, which are useful for forming multilayer printed circuit boards.

It is another object of the present invention to provide novel methods for preparing such a multilayer printed circuit boards.

It is another object of the present invention to provide novel resin compositions, which contain a cyanate compound, and which afford an insulation layer for a printed circuit board, which insulation layer is formed of a cured product of the resin composition, and which insulation layer exhibits excellent dielectric properties and a smoothness on the surface of the insulation layer.

In solving the foregoing problems, the present inventors have focused on the point that when a resin composition is coated on a circuit substrate and this is thermally cured, the resin composition is melted before the curing and the flatness thereof is impaired without maintaining the shape before the curing.

A method in which an adhesive film with a resin composition layer-formed on a support film is used and the resin composition layer of the adhesive film is laminated on the circuit substrate has been widely used for coating a circuit substrate with a resin composition. However, in order to coat the surface of the circuit substrate without generating voids and filling any via holes or through-holes as required, a certain extent of a flowability is required for the resin composition by heating at the time of lamination, and the problem of achieving the desired flatness becomes serious. Accordingly, a method in which the curing speed of the resin composition is increased to cure the resin composition before impairing the shape prior to the curing by melting is considered. However, when the curing speed is increased, such problems tend to arise that when heat-drying the resin composition varnish on a support film for film formation, curing proceeds which impair the ability to laminate or the storage stability of an adhesive film, and the like.

Accordingly, the present inventors have assiduously studied a means for solving the foregoing problems without relying on a method for increasing the curing speed, and have consequently found that incorporating a radical-polymerizable resin into a resin composition which contains a cyanate compound, coating the resin composition on a circuit substrate, photo-curing the resin, and thermally curing the resin affords an insulation layer which is excellent in surface smoothness.

Thus, the present invention provides the following:

(1) A process for producing a printed circuit board, comprising:

(a) coating a resin composition on a circuit substrate, the resin composition comprising: (i) at least one aromatic cyanate compound having two or more cyanato groups in a molecule; and (ii) at least one radical-polymerizable resin;

(b) photo-curing the resin composition, to obtain a photo-cured resin; and (c) thermally curing the photo-cured resin composition to thereby form an insulation layer.

(2) The process according to (1), wherein the radical-polymerizable resin is at least one selected from the group consisting of a vinylbenzyl compound, a vinylbenzyl ether compound, a bismaleimide compound, an acrylate compound, a methacrylate compound, and mixtures thereof.

(3) The process according to (1), wherein the radical-polymerizable resin is a vinylbenzyl compound and/or a vinylbenzyl ether compound.

(4) The process according to (1), wherein the radical-polymerizable resin is a vinylbenzyl compound and/or a vinylbenzyl ether compound having a weight average molecular weight of from 1,500 to 50,000.

(5) The process according to (1) to (4), wherein the resin composition further comprises at least one photo initiator.

(6) The process according to (1) to (5), wherein the resin composition further comprises at least one epoxy resin.

(7) The process according to (1) to (6), wherein the resin composition further comprises at least one phenoxy resin.

(8) The process according to (1) to (7), wherein the resin composition further comprises at least one inorganic filler.

(9) The process according to (7), wherein the phenoxy resin is a phenoxy resin having a weight average molecular weight of from 5,000 to 100,000.

(10) The process according to (1) to (9), wherein the coating of the resin composition on the circuit substrate is conducted by laminating an adhesive film in which the resin composition layer is formed on a support film.

(11) The process according to (1) to (10), which further comprises:
(d) forming a conductor layer on the insulation layer by plating.

(12) A resin composition, comprising:
(a) at least one aromatic cyanate compound having two or more cyanato groups in a molecule;
(b) at least one vinylbenzyl compound and/or at least one vinylbenzyl ether compound; and
(c) at least one photo initiator.

(13) The resin composition according to (12), which further comprises:
(d) at least one epoxy resin.

(14) The resin composition according to (12) or (13), which further comprises:
(e) at least one phenoxy resin.

(15) The resin composition according to (12) to (14), which further comprises:
(f) at least one inorganic filler.

(16) The resin composition according to (12) to (15), wherein the (b) at least one vinylbenzyl compound and/or at least one vinylbenzyl ether compound is a vinylbenzyl compound and/or a vinylbenzyl ether compound having a weight average molecular weight of from 1,500 to 50,000.

(17) The resin composition according to (14) to (16), wherein the (e) at least one phenoxy resin is a phenoxy resin having a weight average molecular weight of from 5,000 to 100,000.

(18) The resin composition according to (12) to (17), wherein the (a) at least one aromatic cyanate compound having two or more cyanato groups in a molecule and the (b) at least one vinylbenzyl compound and/or at least one vinylbenzyl ether compound are present in the resin composition in a weight ratio of from 1:9 to 9:1; and
the (b) at least one vinylbenzyl compound and/or at least one vinylbenzyl ether compound and the (c) at least one photo initiator are present in the resin composition in a weight ratio of from 100:0.5 to 100:15.

(19) An adhesive film, comprising a resin composition layer formed on a support substrate, wherein the resin composition layer comprises:
(a) at least one aromatic cyanate compound having two or more cyanato groups in a molecule;
(b) at least one vinylbenzyl compound and/or at least one vinylbenzyl ether compound; and
(c) at least one photo initiator.

(20) The adhesive film according to (19), wherein the resin composition further comprises:
(d) at least one epoxy resin.

(21) The adhesive film according to claim (19) or (20), wherein the resin composition further comprises:
(e) at least one phenoxy resin.

(22) The adhesive film according to (19) to (21), wherein the resin composition further comprises:
(f) at least one inorganic filler.

(23) The adhesive film according to (19) to (22), wherein the (b) at least one vinylbenzyl compound and/or at least one vinylbenzyl ether compound is a vinylbenzyl compound and/or a vinylbenzyl ether compound having a weight average molecular weight of from 1,500 to 50,000.

(24) The adhesive film according to (21) to (23), wherein the (e) at least one phenoxy resin is a phenoxy resin having a weight average molecular weight of from 5,000 to 100,000.

(25) The adhesive film according to (19) to (24), wherein wherein the (a) at least one aromatic cyanate compound having two or more cyanato groups in a molecule and the (b) at least one vinylbenzyl compound and/or at least one vinylbenzyl ether compound are present in the resin composition in a weight ratio of from 1:9 to 9:1; and
the (b) at least one vinylbenzyl compound and/or at least one vinylbenzyl ether compound and the (c) at least one photo initiator are present in the resin composition in a weight ratio of from 100:0.5 to 100:15.

According to the invention, an insulation layer which exhibits excellent dielectric properties and surface flatness can be introduced into a printed circuit board.

BRIEF DESCRIPTION OF THE DRAWINGS

A more complete appreciation of the invention and many of the attendant advantages thereof will be readily obtained as the same become better understood by reference to the following detailed description when considered in connection with the accompanying drawings, wherein.

DETAILED DESCRIPTION OF THE PREFERRED EMBODIMENTS

In the present invention, the term "an aromatic cyanate compound having two or more cyanato groups in a molecule" as component (a) refers to a cyanate compound having two or more cyanato groups in the molecule and having an aromatic ring skeleton in the molecule. Preferable examples of the aromatic cyanate compound having two or more cyanato groups in a molecule include bisphenol A dicyanate [another name: 2,2-bis(4-cyanatophenyl)propane], polyphenol cyanate [another name: oligo(3-methylene-1,5-phenylene cyanate)], 4,4'-methylenebis(2,6-dimethylphenyl cyanate), 4,4'-ethylidenediphenyl dicyanate, hexafluorobisphenol A dicyanate, a prepolymer in which a part of cyanato groups in these cyanate compounds are bound to triazine, and the like. The cyanate compounds may be used such that two or more different types thereof are combined.

In the present invention, the mixing amount of the "aromatic cyanate compound having two or more cyanato groups in a molecule" in the resin composition is preferably 10% by weight or more, more preferably from 30 to 80% by weight, based on 100% by weight of the resin composition.

In the present invention, the term "a radical-polymerizable resin" used as component (b) is not particularly limited so long as it has one or more carbon-carbon double bonds in the molecule and is radical-polymerizable with light. Preferable examples of the radical-polymerizable resin can include a vinylbenzyl compound, a vinylbenzyl ether compound, a bismaleimide compound, an acrylate compound, a methacrylate compound and the like. As in the case, of the cyanate compounds, two or more different types of the radical-polymerizable resin may be combined.

Examples of the bismaleimide compound include N,N'-ethylenedimaleimide, N,N'-4,4-diphenylmethanebismaleimide, N,N'-m-phenylenebismaleimide, N,N'-4,4-diphenylmethanebismaleimide, N,N'-4,4-diphenylpropanebismaleimide, N,N'-4,4-diphenyl ether bismaleimide, 2,2-bis[4-(4-maleimidephenoxy)phenyl]propane, 2,2-bis[3-ethyl-4-(4-maleimidephenoxy)phenyl]propane, polyphenylmethanemaleimide, bisphenol A diphenyl ether bismaleimide, 3,3'-dimethyl-5,5'-diethyl-4,4'-diphenylmethanebismaleimide, polyether-type bismaleimide acetate ester, and the like.

Examples of the acrylate compound or the methacrylate compound (hereinafter sometimes referred to as "(meth) acrylate compound") include the following (meth)acrylate compounds. The term "(meth)acrylate" hereinafter includes both an acrylate and a methacrylate.

Examples thereof include methyl (meth)acrylate, ethyl (meth)acrylate, propyl (meth)acrylate, butyl (meth)acrylate, isobutyl (meth)acrylate, hexyl (meth)acrylate, cyclohexyl (meth)acrylate, 2-ethylhexyl (meth)acrylate, octyl (meth) acrylate, decyl (meth)acrylate, isodecyl (meth)acrylate, undecyl (meth)acrylate, dodecyl (meth)acrylate, tridecyl (meth)acrylate, tetradecyl (meth)acrylate, pentadecyl (meth) acrylate, hexadecyl (meth)acrylate, heptadecyl (meth)acrylate, octadecyl (meth)acrylate, nonadecyl (meth)acrylate, cosyl (meth)acrylate, eicosyl (meth)acrylate, dimethylaminoethyl (meth)acrylate, dimethylaminoethyl (meth)acrylate, N,N-dimethylaminoethyl (meth)acrylamide, N,N-dimethylaminopropyl (meth)acrylamide, N,N-dimethylaminobutyl (meth)acrylamide, N,N-diethylaminoethyl (meth)acrylamide, N,N-diethylaminopropyl (meth)acrylamide, N,N-diethylaminobutyl (meth)acrylamide, N-(1,1-dimethyl-3-oxobutyl) (meth)acrylamide, N-(1,3-diphenyl-1-ethyl-3-oxobutyl) (meth)acrylamide, N-(1-methyl-1-phenyl-3-oxobutyl) (meth)acrylamide, 2-hydroxyethyl (meth) acrylamide, 1,4-butanediol di(meth)acrylate, 1,4-butanediol di(meth)acrylate, 1,6-hexanediol (meth)acrylate, 1,9-nonanediol (meth)acrylate, neopentyl glycol di(meth)acrylate, tetraethylene glycol di(meth)acrylate, tripropylene glycol di(meth)acrylate, polypropylene glycol di(meth) acrylate, ethylene glycol di(meth)acrylate, diethylene glycol di(meth)acrylate, triethylene glycol di(meth)acrylate, polyethylene glycol di(meth)acrylate, 1,6-hexanediol di(meth) acrylate, neopentyl glycol di(meth)acrylate, bisphenol A ethylene oxide-modified di(meth)acrylate, pentaerythritol tri(meth)acrylate, trimethylolpropane tri(meth)acrylate, trimethylolpropane tri(meth)acrylate, trimethylolpropane ethylene oxide-modified tri(meth)acrylate, trimethylolpropane propylene oxide-modified(meth)acrylate, isocyanuric acid ethylene oxide-modified tri(meth)acrylate, pentaerythritol tetra(meth)acrylate, dipentaerythritol penta(meth)acrylate, dipentaerythritol hexa(meth)acrylate, 2-hydroxyethyl (meth)acrylate, 2-hydroxybutyl (meth)acrylate, 4-hydroxybutyl (meth)acrylate, 2-hydroxypropyl (meth)acrylate, 2-ethylhexyl(meth)acrylate, 2-methoxyethyl (meth)acrylate, 3-methoxybutyl (meth)acrylate, butoxyethyl (meth)acrylate, caprolactone-modified 2-hydroxyethyl (meth)acrylate, phenoxyethyl (meth)acrylate, dicyclopentanyl (meth)acrylate, dicyclopentenyloxyethyl (meth)acrylate, isobornyl (meth) acrylate, acryloylmorpholine, isodecyl (meth)acrylate, methoxytripropylene glycol (meth)acrylate, methoxypolyethylene glycol (meth)acrylate, tetrahydrofurfuryl (meth) acrylate, nonylphenoxyethyl (meth)acrylate, p-cumylphenoxyethyl (meth)acrylate, 3-phenyloxy-2-hydroxypropyl (meth)acrylate, polyethylene glycol mono(meth)acrylate), bisphenol A polyethoxydi(meth)acrylate, bisphenol A polypropoxydi(meth)acrylate, hydroxypivalic acid neopentylglycol di(meth)acrylate, neopentylglycol polypropoxydi (meth)acrylate, tricyclodecane dimethanol di(meth)acrylate, 5-ethyl-2-(2-hydroxy-1,1-dimethylethyl)-5-(hydroxymethyl)-1,3-dioxane di(meth)acrylate, glycerin polypropoxytri(meth)acrylate, trimethylolpropane tri(meth)acrylate, trimethylolpropane polyethoxytri(meth)acrylate, pentaerythritol tri or tetra(meth)acrylate, ditrimethylolpropane tetra(meth) acrylate, ε-caprolactone-modified dipentaerythritol poly (meth)acrylate, dipentaerythritol penta or hexa(meth)acrylate, and the like.

As the (meth)acrylate compound, a polyfunctional epoxy (meth)acrylate obtained by reacting an epoxy compound with acrylic acid or methacrylic acid is preferable.

The epoxy compound is not particularly limited, and examples thereof include epoxy compounds such as a bisphenol A-type epoxy compound, a bisphenol F-type epoxy compound, a bisphenol S-type epoxy compound, a phenol novolak-type epoxy compound, a cresol novolak-type epoxy compound, and an aliphatic epoxy compound.

As the (meth)acrylate compound, a polyfunctional epoxy (meth)acrylate compound obtained by reacting a reaction product of an epoxy compound and acrylic acid or methacrylic acid with an acid anhydride is especially preferable.

Examples of the acid anhydride include dibasic acid anhydrides such as maleic anhydride, succinic anhydride, itaconic anhydride, phthalic anhydride, tetrahydrophthalic anhydride, hexahydrophthalic anhydride, phthalic methylhexahydroanhydride, endomethylenetetrahydrophthalic anhydride, methylendomethylenetetrahydrophthalic anhydride, chlorendic anhydride, and phthalic methyltetrahydroanhydride; aromatic polybasic carboxylic anhydrides such as trimellitic anhydride, pyromellitic anhydride, and benzophenonetetracarboxylic dianhydride; 5-(2,5-dioxotetrahydrofuryl)-3-methyl-3-cyclohexene-1,2-dicarboxylic anhydride; endobicyclo-[2,2,1]-hepto-5-en-2,3-dicarboxylic anhydride; and the like.

As the radical-polymerizable resin, a vinylbenzyl compound and a vinylbenzyl ether compound which exhibit excellent dielectric properties (low dielectric constant and low dielectric dissipation factor) are especially preferable.

As the vinylbenzyl ether compound, a compound having an aromatic ring or an alicyclic structure having two or more vinylbenzyl ether groups in a molecule is preferably used.

The polyvinylbenzyl ether compound used in the present invention can be obtained by, for example, reacting a compound having two or more hydroxybenzyl groups in a molecule (polyphenol compound) with vinylbenzyl halide (see, JP-A-9-31006, JP-A-2001-181383, and the like).

Examples of the polyphenol compound include hydroquinone, bisphenol A, bisphenol F, bisphenol S, biphenol, a phenol novolak resin, a condensate of phenol and benzaldehyde, a Xylok-type phenol resin, and the like. The aromatic ring of these compounds may be substituted with an alkyl group, halogen, or the like.

Examples of the vinylbenzyl halide include p-vinylbenzyl chloride, m-vinylbenzyl chloride, a mixture of any of them, and the like.

Typical examples of the polyvinylbenzyl ether compound can include compounds represented by the following formula (1) (see, JP-A-9-31006, JP-A-2001-181383 and the like).

wherein $R^1$ represents a methyl group or an ethyl group, $R^2$ represents a hydrogen atom or a hydrocarbon group having 1 to 10 carbon atoms, $R^3$ represents a hydrogen atom or a vinylbenzyl group (provided the hydrogen atom to vinylbenzyl group molar ratio is from 60:40 to 0:100), and n represents an integer of from 2 to 4.

These polyvinylbenzyl ether compounds can easily be produced according using the description in JP-A-9-31006 and JP-A-2001-181383.

Examples of commercially available products include V-1000X (cured product: Tg 160° C., dielectric constant 2.7, dielectric dissipation factor 0.0045) and V-1100X (cured product: Tg 171° C., dielectric constant 2.56, dielectric dissipation factor 0.0038) manufactured by Showa Highpolymer Co., LTD. and the like.

As the vinylbenzyl compound, a vinylbenzyl compound with an aromatic ring or alicyclic structure having two or more vinylbenzyl groups in a molecule is preferably used.

The vinylbenzyl compound used in the present invention can be obtained by, for example, (1) reacting an indene compound in the presence of vinylbenzyl halide and alkali, in the presence of vinylbenzyl halide, a dihalomethyl compound having from 2 to 20 carbon atoms, and alkali, or in the presence of a fluorene compound, vinylbenzyl halide, a dihalomethyl compound having from 2 to 20 carbon atoms, and alkali (see, JP-A-2003-277440).

Further, it can be obtained by, for example, (2) reacting a fluorene compound and vinylbenzyl dihalide, allyl halide, or propargyl halide with a dihalomethyl compound having from 2 to 20 carbon atoms in the presence of alkali (see, JP-A-2003-283076 and WO 02/083610).

In the foregoing method (1), the indene compound used as a starting material includes indene compounds represented by the following formula (2).

wherein R4 represents at least one group selected from a hydrogen atom, a halogen atom, an alkyl group having from 1 to 5 carbon atoms, an alkoxy group, a thioalkoxy group, a thioaryloxy group, and an aryl group.

Examples of the vinylbenzyl halide include the foregoing compounds. Examples of the dihalomethyl compound having from 2 to 20 carbon atoms can include alkylene dihalides such as 1,2-dichloroethane, 1,2-dibromoethane, 1,3-dichloropropane, 1,3-dibromopropane, 1,4-dichlorobutane, and 1,4-dibromobutane; and dihalomethyl compounds such as o-xylylene dichloride, o-xylylene dibromide, m-xylylene dichloride, m-xylylene dibromide, p-xylylene dichloride, p-xylylene dibromide, 4,4'-bis(chloromethyl)biphenyl, 4,4'-bis(chloromethyl)diphenyl ether, 4,4'-bis(chloromethyl)diphenyl sulfide, 2,6-bis(bromomethyl)naphthalene, 1,8-bis(bromomethyl)naphthalene, and 1,4-bis(chloromethyl)naphthalene.

Examples of alkali include sodium methoxide, sodium ethoxide, sodium hydride, potassium hydride, sodium hydroxide, potassium hydroxide, and the like.

An especially preferable polyvinylbenzyl compound includes compounds represented by the following formulas (3) and (4).

wherein R5 to R7 each independently represent a vinylbenzyl group or a hydrogen atom (provided at least any one of R5 to R7 represents a vinylbenzyl group), R8 represents a hydrogen atom, a halogen atom or an alkyl group having from 1 to 5 carbon atoms.

(4)

wherein R9 represents an organic group (preferably an alkylene group) having from 2 to 20 carbon atoms, and m represents an integer of from 0 to 20.

Examples of the commercially available products include polyvinylbenzyl resins, V-5000X (cured product: Tg 154° C., dielectric constant 2.63, dielectric dissipation factor 0.0016) and V-6000X (cured product: Tg 136° C., dielectric constant 2.59, dielectric dissipation factor 0.0013) manufactured by Showa Highpolymer Co., LTD. and the like.

As the vinylbenzyl compound and/or the vinylbenzyl ether compound, a vinylbenzyl compound and/or a vinylbenzyl ether compound having a weight average molecular weight of from 1,500 to 50,000 can preferably be used. When the weight average molecular weight is less than 1,500, the increase in viscosity of the resin composition by photo-curing might be insufficient. When it exceeds 50,000, the miscibility with the cyanate compound might be decreased. In the context of the present invention, the weight average molecular weight is a value measured by the gel permeation chromatography (GPC) method (calculated as polystyrene). The weight average molecular weight according to the GPC method can specifically be measured at a column temperature of 40° C. using LC-9A/RID-6A manufactured by Shimadzu Corporation as the measuring device, Shodex K-800 P/K-804L/K-804L manufactured by Showa Denko K. K. as the column and chloroform as the mobile phase, and it can be calculated using a calibration curve of standard polystyrene.

The radical-polymerizable resin in the present invention is used in an amount such that the mixing ratio between the aromatic cyanate compound and the radical-polymerizable resin in the resin composition is preferably from 1:9 to 9:1, more preferably from 3:7 to 8:2 in terms of a weight ratio.

The mixing amount of the "radical-polymerizable resin" in the resin composition of the invention is preferably 10% by weight or more, more preferably from 20 to 70% by weight, based on 100% by weight of the resin composition.

The total mixing amount of the "aromatic cyanate compound having two or more cyanato groups in a molecule" and the "radical-polymerizable resin" in the resin composition of the invention is preferably 10% by weight or more, more preferably from 20 to 80% by weight, based on 100% by weight of the resin composition.

The "photo initiator" as component (c) in the present invention is not particularly limited. Examples thereof include benzophenones such as benzophenone, benzoyl benzoate, 4-phenylbenzophenone, hydroxybenzophenone, 4-benzoyl-4'-methyldiphenyl sulfide and 4,4'-bismethylaminobenzophenone, benzoin, benzoin alkyl ethers such as benzoin methyl ether, benzoin ethyl ether, benzoin isopropyl ether, benzoin butyl ether, and benzoin isobutyl ether; acetophenones such as acetophenone, 4-phenoxydichloroacetophenone, 4-t-butyl-dichloroacetophenone, 4-t-butyl-trichloroacetophenone, diethoxyacetophenone, 2,2-diethoxy-2-phenylacetophenone, 1,1-dichloroacetophenone, 2-hydroxy-2-methyl-phenylpropan-1-one, diethoxyacetophenone, 1-hydroxychlorohexylphenylketone, and 2-methyl-1-[4-(methylthio)phenyl]-2-morpholinopropan-1-one; thioxanthones such as thioxanthone, 2,4-diethylthioxanthone, 2-isopropylthioxanthone, 2-chlorothioxanthone, 2-chlorothioxanthone, 2-methylthioxanthone, and 2,4-dimethylthioxanthone; alkylanthraquinones such as 2-ethylanthraquinone, 2-t-butylanthraquinone, 2-chloroanthraquinone, and 2-amylanthraquinone; ketals such as acetophenone dimethylketal and benzyldimethylketal; phosphine oxides such as 2,4,6-trimethylbenzoyldiphenylphosphine oxide and bis(2,4,6-trimethylbenzoyl)-phenylphosphine oxide, and the like.

The photo initiator in the invention is used in an amount such that the ratio between the radical-polymerizable resin and the photo initiator in the resin composition is preferably from 100:0.5 to 100:15, more preferably from 100:1 to 100:10 in terms of a weight ratio.

The resin composition of the present invention may contain a thermosetting resin other than the aromatic cyanate compound. Examples of the thermosetting resin include an epoxy resin, a polymer of a bismaleimide compound and a diamine compound, a bisallylnazide resin, a benzooxazine compound, a benzocyclobutene compound, and the like. The thermosetting resins may be used in admixture of two or more thereof.

Since the cyanate compound has to be cured at a high temperature for a relatively long period of time, it is advisable to use the cyanate compound in combination with an epoxy resin (component (d) in the invention) for decreasing the curing temperature. Since the reaction of reacting the epoxy group of the epoxy resin with the cyanato group of the cyanate compound to form an oxazoline ring is a main reaction, generation of a hydroxyl group that impairs a dielectric dissipation factor after thermal curing or persistance of a cyanato group that impairs a dielectric dissipation factor is also inhibited. As the epoxy resin, an aromatic epoxy resin having two or more epoxy groups in a molecule can preferably be used.

The term "aromatic epoxy resin having two or more epoxy groups in a molecule" refers to an epoxy resin having two or more epoxy groups in a molecule and having an aromatic ring skeleton in a molecule. Preferable examples of the aromatic epoxy resin having two or more epoxy groups in a molecule include a bisphenol A-type epoxy resin, a bisphenol F-type epoxy resin, a bisphenol S-type epoxy resin, a phenol novolak-type epoxy resin, an alkylphenol novolak-type epoxy resin, a biphenyl-type epoxy resin, a dicyclopentadiene-type epoxy resin, an epoxidized condensate of phenols and aromatic aldehydes having a phenolic hydroxyl group, a naphthalene-type epoxy resin, triglycidyl isocyanurate, an epoxy-modified polybutadiene, these epoxy resins which are brominated or phosphorus-modified, and the like. These epoxy resins may be used either singly or in combination of two or more thereof.

Regarding the mixing ratio of the epoxy resin in the invention, it is preferable that the ratio between the number of epoxy groups present in a molecule of the epoxy resin and the number of cyanato groups present in the molecule of the cyanate compound is from 1:0.5 to 1:3. Specifically, it is preferable to use the epoxy resin in an amount such that the ratio between the epoxy group equivalent of the epoxy resin and the cyanato group equivalent of the cyanate compound in the resin composition is in the range of from 1:0.5 to 1:3. When the ratio deviates from this range, a satisfactorily low value of a dielectric dissipation factor is sometimes not obtained owing to unreacted epoxy groups or cyanato groups remaining after the curing. When the resin composition contains a compound with an epoxy group other than the "aromatic epoxy resin having two or more epoxy groups in a molecule" and a compound with a cyanato group other than the "aromatic cyanate compound having two or more cyanato groups in a molecule", the ratio between the epoxy group and the cyanato group including those of these other components is set within the foregoing range. That is, it is preferable that the ratio between the total number of epoxy groups and the total number of cyanate groups present in the resin composition is from 1:05 to 1:3.

The resin composition of the present invention may contain a phenoxy resin. A phenoxy resin is further incorporated into the resin composition containing the cyanate compound and the epoxy resin to thereby accelerate the curing and improve the thermosetting property of the resin composition. The phenoxy resin is a polymer comprising a reaction product of a difunctional epoxy resin and a bisphenol compound. It is considered that since the hydroxyl group present in the molecule acts to accelerate the curing of the epoxy group and the cyanato group, satisfactory curing properties (heat resistance, low dielectric dissipation factor, and the like) can be exhibited at a relatively low curing temperature. Further, the incorporation of the phenoxy resin improves the roughening property of the epoxy resin cured product with an oxidizing agent and also the adhesion of a conductor layer formed by plating.

It is also possible to use a phenoxy resin obtained by reacting an epoxy group remaining in the end with (meth) acrylic acid or a phenoxy resin obtained by reacting a part of the hydroxyl groups with a methacrylate compound or an acrylate compound having an isocyanate group. In this case, these phenoxy resins also act as a radical-polymerizable resin.

Preferable examples of the phenoxy resin include bisphenol A-type Phenotohto YP50 (manufactured by Tohto Kasei Co., Ltd.), E-1256 (manufactured by Japan Epoxy Resin K.K.), Phenotohto YPB40 (manufactured by Tohto Kasei Co., Ltd.) which is a brominated phenoxy resin, and the like. Especially, a phenoxy resin having a biphenyl skeleton is preferable in view of heat resistance, moisture resistance, and curing acceleration activity. Specific examples of such a phenoxy resin can include YL6742BH30, YL6835BH40, YL6953BH30, YL6954BH30, YL6974BH30, and YX8100BH30 which are phenoxy resins comprising reaction products of a bisphenol-type epoxy resin (YX4000 manufactured by Japan Epoxy Resin K.K.) and various bisphenol compounds. These phenoxy resins may be used either singly or in combination of two or more thereof.

The phenoxy resin improves the curing acceleration activity and the flexibility of the adhesive film to make the handling thereof easy, and also improves the mechanical strength and flexibility of a cured product. As the phenoxy resin, a phenoxy resin having a weight average molecular weight of from 5,000 to 100,000 can preferably be used. When the weight average molecular weight of the phenoxy resin is less than 5,000, the foregoing effects might be insufficient. When it exceeds 100,000, the dissolution in the epoxy resin and the organic solvent is extremely reduced to make its practical use difficult.

The mixing amount of the phenoxy resin varies with its type. It is preferably from 3 to 40 parts by weight per 100 parts by weight, based on the total weight of: (1) the cyanate compound; or (2) the cyanate compound and the epoxy resin. Especially, it is preferable that the phenoxy resin is mixed in the range of from 5 to 25 parts by weight. When the amount is less than 3 parts by weight, the curing acceleration activity of the resin composition might be insufficient. When the resin composition is laminated on the circuit substrate or the laminated resin composition is thermally cured, the thickness of an insulation layer tends to be non-uniform owing to too high a fluidity of the resin. Further, the roughening property of the cured product for formation of the conductor layer is hardly obtained. Meanwhile, when it exceeds 40 parts by weight, the functional group of the phenoxy resin comes to be in excess, and a satisfactorily low value of a dielectric dissipation factor is hardly obtained. Moreover, since the fluidity in laminating the adhesive film on a circuit substrate is too low, it is difficult to satisfactorily fill the resin in via holes or through-holes present in the circuit substrate.

An inorganic filler may be added, as required, to the resin composition of the present invention for decreasing the thermal expansion coefficient of the insulation layer to be formed.

Examples of the inorganic filler include silica, silicon particles, alumina, barium sulfate, talc, clay, mica powder, aluminum hydroxide, magnesium hydroxide, calcium carbonate, magnesium carbonate, magnesium oxide, boron nitride, aluminum borate, barium titanate, strontium titanate, calcium titanate, magnesium titanate, bismuth titanate, titanium oxide, barium zirconate, calcium zirconate, and the like. Silica is especially preferable. An inorganic filler having an average particle size of 5 µm or less is preferable. When the average particle size exceeds 5 µm, it is sometimes difficult to stably form a fine pattern when forming a circuit pattern on the conductor layer. By the way, the average particle size can be measured by a laser diffraction/scattering-type particle size distribution measuring device LA-500 manufactured by Horiba., Ltd. An inorganic filler which is surface-treated with a surface treating agent such as a silane coupling agent for improving a moisture resistance is preferable.

The addition amount of the inorganic filler varies with the properties of the epoxy resin composition or required activities thereof in the invention. However, when the total resin composition is considered as 100% by weight, the inorganic filler is incorporated in the range of, usually from 5 to 80% by weight, preferably from 10 to 75% by weight, more preferably from 20 to 65% by weight, based on the total weight of the resin composition.

When the resin composition of the present invention contains, in addition to components (a) and (b), one or more of any of components (c), (d), (e), and (f), the total amount of these components (c), (d), (e), and (f) can be preferably 25% by weight or more, more preferably 30% by weight or more, based on the total weight of the resin composition.

An organometallic compound which is used as a curing catalyst may further be added, as required, to the resin composition of the present invention for shortening the curing time. Examples of such an organometallic compound include organocopper compounds such as copper (II) acetylacetonate; organozinc compounds such as zinc (II) acetylacetonate; and organocobalt compounds such as cobalt (II) acetylacetonate and cobalt (III) acetylacetonate. The amount of the organometallic compound added is usually from 10 to 500 ppm, preferably from 25 to 200 ppm, calculated as metal, relative to the weight of the cyanate compound.

In the resin composition of the present invention, other thermosetting resins or thermoplastic resins and additives can be incorporated, as required, unless the effects of the invention are impaired. Examples of the thermosetting resins include a monofunctional epoxy resin as a diluent, an alicyclic polyfunctional epoxy resin, a rubber-modified epoxy resin, an acid anhydride-type compound, a blocked isocyanate resin and a xylene resin as an epoxy resin curing agent, and the like. Examples of the thermoplastic resin include a polyimide resin, a polyamideimide resin, a polyether imide resin, a polysulfone resin, a polyether sulfone resin, a polyphenylene ether resin, a polycarbonate resin, a polyether ether ketone resin, a polyester resin, and the like. Examples of the additives can include organic fillers such as a silicone powder, a nylon powder, and a fluorine powder; thickening agents such as orben and Benton; silicone-based, fluorine-based and polymeric defoamers or leveling agents; adhesion imparting agents such as imidazole, thiazole, triazole, and silane coupling agents; colorants such as phthalocyanine blue, phthalocyanine green, iodine green, diazo yellow, and carbon black; and the like.

Since the resin composition of the present invention contains the cyanate compound as a main component, it can form a cured product which exhibits excellent heat resistance and electrical properties. For example, a cured product can be formed which meets a condition of a dielectric dissipation factor (for example, 0.015 or less under conditions of a measurement frequency of 1 GHz and a temperature of 23° C.) required for a printed circuit board used in a high-frequency region.

The adhesive film of the present invention can be produced by dissolving the above-described resin composition in an organic solvent to form a resin varnish, then coating this varnish on a base film as a support (support film) and drying the solvent by hot air blowing or the like.

A skilled person can determine the preferable drying conditions, as required, by a simple experiment. For example, a varnish containing from 30 to 60% by weight of the organic solvent can be dried at from 80 to 100° C. for from 3 to 10 minutes. The amount of the organic solvent remaining in the resin composition is usually 10% by weight or less, preferably 5% by weight or less, based on the total weight of the resin layer.

In the adhesive film of the present invention, the layer of the composition formed on the support film preferably has a thickness of from 10 to 200 µm to a thickness which is larger than the thickness of the conductor in the circuit substrate for lamination, and preferably from 10 to 150 µm.

A protective film corresponding to the support film can further be laminated on the surface of the resin composition layer to which the support film is not adhered. The thickness of the protective layer is preferably from 1 to 40 µm. The protection with the protective film can prevent adhesion of a dust or the like to the surface of the composition layer or damage of this surface. The adhesive film may be stored by being wound in a roll.

Examples of the support film can include polyolefins such as polyethylene and polyvinyl chloride; polyesters such as polyethylene terephthalate (hereinafter sometimes abbreviated as "PET") and polyethylene naphthalate; polycarbonate; polyimide; release paper; metallic foils such as copper foil and aluminum foil; and the like. The support film may be subjected to a mud treatment, a corona treatment, or a release treatment.

Examples of the organic solvent used to prepare the varnish can include ketones such as acetone, methyl ethyl ketone, and cyclohexanone; acetate esters such as ethyl acetate, butyl acetate, cellosolve acetate, propylene glycol monomethyl ether acetate, and carbitol acetate; cellosolves such as cellosolve and butyl cellosolve; carbitols such as carbitol and butyl carbitol; aromatic hydrocarbons such as toluene and xylene; dimethylformamide; dimethylacetamide; N-methylpyrrolidone; and the like. These organic solvents may be used either singly or in combination of two or more thereof.

With respect to the substrate used as the circuit substrate, a glass epoxy substrate, a metallic substrate, a polyester substrate, a polyimide substrate, a BT resin substrate, a thermosetting polyphenylene ether substrate, and the like can be used. By the way, the circuit substrate of the present invention refers to the foregoing substrate on which patterned conductor layer(s) (circuit(s)) is (are) formed on one or both surfaces. With respect to a multilayer printed circuit board in which a conductor layer and an insulation layer are alternately laminated, a case in which one or both surfaces of the outermost layer on the multilayer printed circuit board is (are) patterned conductor layer(s) (circuit(s)) is also included in the circuit substrate referred to in the present invention. The surface of the conductor layer may previously be roughened by a black oxide treatment or the like.

In the step of coating the resin composition comprising the aromatic cyanate compound having two or more cyanato groups in a molecule and the radical-polymerizable resin on the circuit substrate, the varnish of the resin composition can be formed and directly coated on the circuit substrate. Preferably, this step can be conducted by forming an adhesive film and laminating this on the circuit substrate.

The adhesive film of the present invention can advantageously be laminated on the circuit substrate with a vacuum laminator. The lamination method may be batchwise or continuous with a roll. Before the lamination is conducted, the adhesive film and the circuit substrate may be heated (preheated) as required. Examples of a commercially available vacuum laminator include a vacuum applicator manufactured by Nichigo Morton Co., Ltd., a vacuum-pressing type laminator manufactured by Meiki Co., Ltd., a roll-type dry coater manufactured by Hitachi Industries Co., Ltd, a vacuum laminator manufactured by Hitachi AIC Inc., and the like.

In the lamination, when the adhesive film has a protective film, the protective film is removed, and the adhesive film is then laminated on the circuit substrate while being pressed and heated. Regarding the conditions of lamination, it is advisable that the lamination is conducted at a temperature of 70 to 140° C., a press-bonding pressure of, preferably from 1 to 11 kgf/cm$^2$ (from $9.8 \times 10^4$ to $107.9 \times 10^4$ N/m$^2$) under reduced air pressure of 20 mmHg (26.7 hPa) or less. After the lamination, the temperature is reduced to approximately room temperature, and the support film is then removed as required.

After lamination, the resin composition laminated on the circuit substrate is photo-cured. The photo-curing can be conducted by irradiating the resin composition with actinic light. When the support film transmits actinic light, the irradiation with actinic light can be conducted through the support film. When it does not transmit actinic light, the irradiation is conducted after removing the support film. As a light source of actinic light, known light sources are may be used. For example, ultraviolet light (UV) lamps, such as a carbon arc lamp, a mercury vapor arc lamp, an ultrahigh pressure mercury lamp, a high pressure mercury lamp, and a xenon lamp, are preferably used. With respect to a dose, a skilled person can set an optimum dose as occasion demands so long as the effects of the invention are exhibited. The irradiation can be conducted at a dose of, preferably from 100 to 5,000 mJ/cm$^2$, more preferably from 300 to 3,000 mJ/cm$^2$.

After photo-curing, the photo-cured resin composition is thermally cured. When the support film is not removed before the photo-curing step, this support film may be removed at this time. The thermal curing conditions are usually selected from the range of from 150° C. to 220° C. and from 20 minutes to 180 minutes. Preferable conditions are from 160° C. to 200° C. and from 30 to 120 minutes. When a support film subjected to a release treatment is used, the support film may be removed after the thermal curing step.

On the surface of the thus-obtained insulation layer, the concave-convex gap can be 4 µm or less, preferably 3 µm or less, and it is possible to form an insulation layer which has excellent flatness.

After the insulation layer is thus formed with the cured product of the resin composition, the insulation layer may be bored, as required, with a drill, a laser or the like to form via holes or through-holes.

The conductor layer is formed on the insulation layer by dry plating or wet plating. As for dry plating, a known method such as deposition, sputtering, or ion plating can be used. In the wet plating, the surface of the cured resin composition layer (insulation layer) is first roughened with an oxidizing agent such as a permanganate (potassium permanganate, sodium permanganate, or the like), a bichromate, ozone, hydrogen peroxide/sulfuric acid, or nitric acid to form an uneven anchor. As the oxidizing agent, a sodium hydroxide aqueous solution of potassium permanganate, sodium permanganate, or the like (alkaline permanganate aqueous solution) is preferably used. Then, the conductor is formed by a method which is a combination of electroless plating and electroplating. It is also possible that a plating resist having an opposite pattern to that of the conductor layer is formed and the conductor layer is formed by electroless plating alone. According to the wet method, via hole or through-hole wall surfaces can also be plated simultaneously. As a method for forming a circuit on the conductor layer, for example, a subtractive method or a semi-additive method which is known to a skilled person can specifically be used. A multilayer printed circuit board can also be produced by repeating such a procedure to alternately laminate the conductor layer and the insulation layer through a build-up method.

During the foregoing coating step (laminating step), photo-curing step, thermal curing step, boring step, plating step, and circuit formation step, any other step such as a mechanical polishing step or a plasma treating step of the insulation layer may be included as required.

Other features of the invention will become apparent in the course of the following descriptions of exemplary embodiments which are given for illustration of the invention and are not intended to be limiting thereof.

EXAMPLES

Example 1

40 parts by weight of a prepolymer of bisphenol A dicyanate (Prima Set BA230S75 of Lonza Japan Ltd., methyl ethyl ketone(MEK) varnish with a cyanate equivalent of approximately 232 and a nonvolatile content of 75%), 40 parts by weight of a vinylbenzyl resin (V-5000OX manufactured by Showa Highpolymer Co., LTD., toluene varnish with a nonvolatile content of 65%), 15 parts by weight of a phenoxy resin varnish having a biphenyl skeleton (YL6954BH30 manufactured by Japan Epoxy Resins Co., Ltd., MEK/cyclohexanone varnish with a weight average molecular weight of 38,000 and a nonvolatile content of 30%), 2 parts by weight of a 1% N,N-dimethylformamide solution of cobalt (II) acetylacetonate, and 40 parts by weight of spherical silica (average particle size 1.1 µm) were added to produce a resin composition varnish. The varnish was coated on a PET film having a thickness of 38 µm with a die coater such that the thickness after drying was 40 µm, and dried at from 80 to 120° C. for 10 minutes to obtain an adhesive film.

Example 2

40 parts by weight of a prepolymer of bisphenol A dicyanate (Prima Set BA230S75 of Lonza Japan Ltd., MEK varnish with a cyanate equivalent of approximately 232 and a nonvolatile content of 75%), 20 parts by weight of a vinylbenzyl resin (V-5000X manufactured by Showa Highpolymer Co., LTD., toluene varnish with a nonvolatile content of 65%), an acrylate of a biphenyl-type epoxy resin (ZCA-251H manufactured by Nippon Kayaku Co., Ltd., propylene glycol monomethyl ether acetate with a nonvolatile content of 70%), a bisphenol A-type epoxy resin (Epikote 828EL with an epoxy equivalent of 185, manufactured by Japan Epoxy Resins Co., Ltd.), 20 parts by weight of a phenoxy resin varnish having a biphenyl skeleton (YL6954BH30 manufactured by Japan Epoxy Resins Co., Ltd., MEK/cyclohexanone varnish with a weight average molecular weight of 38,000 and a nonvolatile content of 30%), 3 parts by weight of a 1% N,N-dimethylformamide solution of cobalt (II) acetylacetonate, 0.7 part of a photo initiator (Speedcure 3060 of Nihon SiberHegner K. K.), and 40 parts by weight of spherical silica (average particle size 1.1 µm) were added to produce a resin composition varnish. The varnish was coated on a PET film having a thickness of 38 µm with a die coater such that the thickness after drying was 40 µm, and dried at from 80 to 120° C. for 10 minutes to obtain an adhesive film.

Example 3

40 parts by weight of a prepolymer of bisphenol A dicyanate (Prima Set BA230S75 of Lonza Japan Ltd., MEK varnish with a cyanate equivalent of approximately 232 and a nonvolatile content of 75%), 40 parts by weight of a vinylbenzyl ether of a Xylok-type phenol resin (SA-1 X manufactured by Showa Highpolymer Co., LTD., toluene varnish with a nonvolatile content of 75%), 4 parts by weight of a 1% N,N-dimethylformamide solution of cobalt (II) acetylacetonate, and 40 parts by weight of spherical silica (average particle size 1.1 µm) were added to produce a resin composition varnish. The varnish was coated on a PET film having a thickness of 38 µm with a die coater such that the thickness after drying was 40 µm, and dried at from 80 to 120° C. for 10 minutes to obtain an adhesive film.

Measurement of the Curing Behavior of Resin Compositions.

Figure 2:
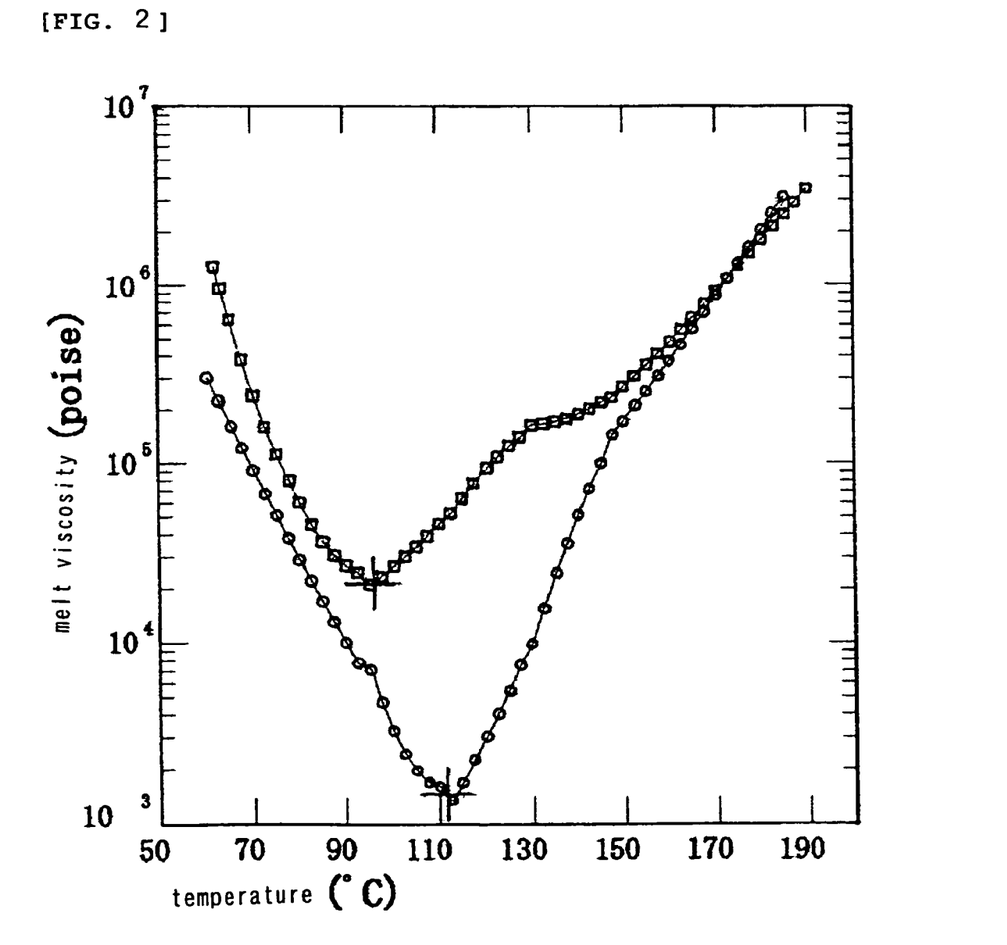
FIG. 2 shows the results of measuring the kinematic viscoelasticity of the resin composition layer in Example 1 and the resin composition layer after UV irradiation (□, 2,000 mJ/cm$^2$ irradiation; o, non-irradiation)
Figure 3:
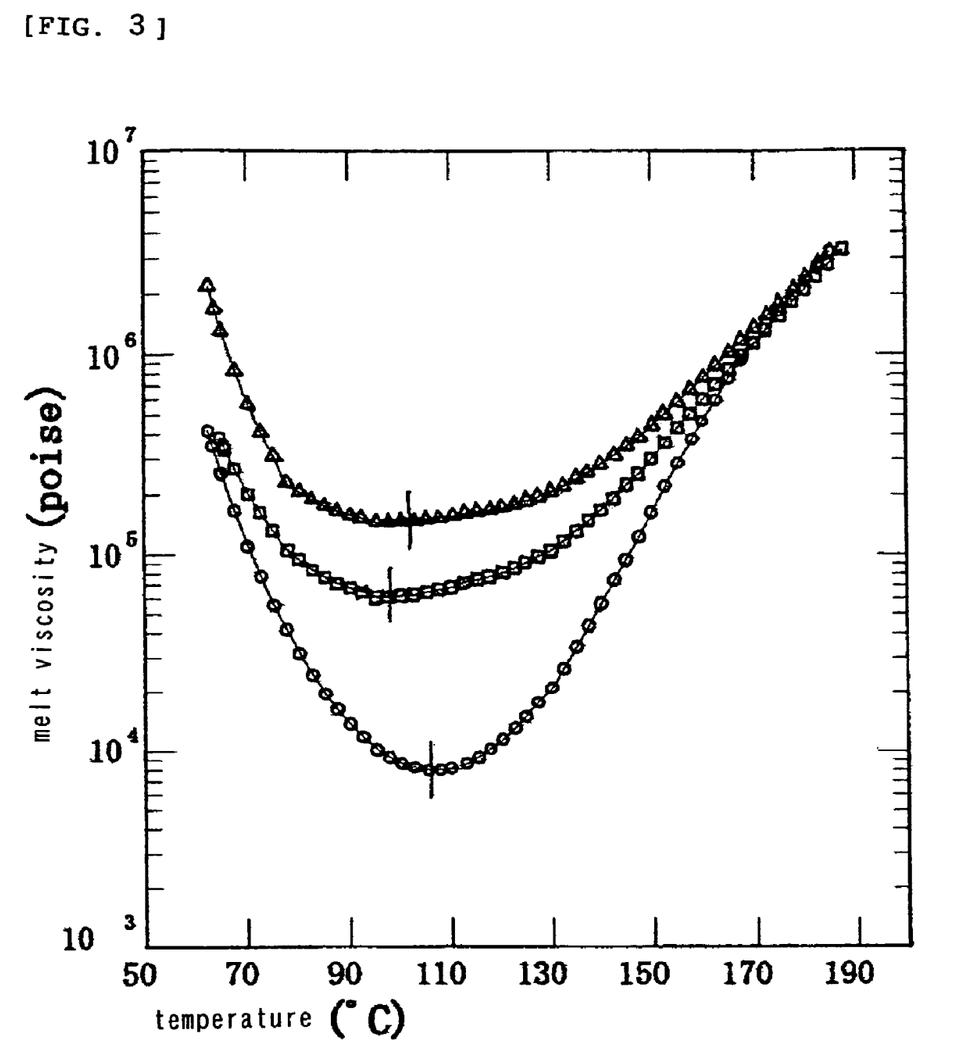
FIG. 3 shows the results of measuring the kinematic viscoelasticity of the resin composition layer in Example 2 and the resin composition layer after UV irradiation (Δ, 2,000 mJ/cm$^2$ irradiation; □, 1,000 mJ/cm$^2$ irradiation; o, non-irradiation).

The dynamic viscoelasticities of the resin composition layer samples of the adhesive films obtained in Examples 1 and 2 and the same resin composition samples after irradiating (at a dose of 2,000 mJ/cm$^2$ for the resin composition of Example 1 and at doses of 1,000 and 2,000 mJ/cm$^2$ for the resin composition of Example 2) using a conveyor-type UV irradiation device (EYE GRANDAGE) manufactured by Eye Graphics K.K., were measured using Rheosol-G3000 manufactured by UBM Co., Ltd. The resin composition layers were formed into tablets (weight approximately 1 g) having a diameter of 20 mm and a thickness of 2.3 mm as measurement samples, and the samples were measured using a parallel plate under conditions of a measurement starting temperature of 60° C., a rate of temperature rise of 5° C./min, a measurement interval temperature of 2.5° C., a frequency of 1 Hz/deg, and a constant 100 g static load. The results of measuring the dynamic viscoelasticity of the resin composition layer of Example 1 and the same resin composition layer after UV irradiation are shown in FIG. 2, and the results of measuring the dynamic viscoelasticity of the resin composition layer of Example 2 and the same resin composition layer after the UV irradiation are shown in FIG. 3. The minimum melt viscosity value of each sample measured is shown in Table 1.

TABLE 1

|  | Example 1 | | Example 2 | | |
| --- | --- | --- | --- | --- | --- |
|  | Before UV irradiation | After UV (2000 mJ/cm2) irradiation | Before UV irradiation | After UV (1000 mJ/cm2) irradiation | After UV (2000 mJ/cm2) irradiation |
| Minimum melt viscosity [poise] | 1460 (96.1° C.) | 21600 (111.8° C.) | 8050 (105.9° C.) | 61500 (98.0° C.) | 149000 (102.0° C.) |

The parenthesized values are the temperatures at which the minimum melt viscosity was measured.

Evaluation of the Surface Flatness of Resin Compositions

The adhesive film obtained in each of Examples 1 and 2 was vacuum-laminated on a test coupon of a comb pattern with a conductor thickness of 35 μm and line/space=160 μm/160 μm under conditions of a temperature of 110° C., a pressure of 5 kgf/cm$^2$ (49×10$^4$ N/m$^2$), an atmospheric pressure of 5 mmHg (6.7 hPa) or less, and a pressing time of 30 seconds. The laminate was then heat-pressed at a temperature of 110° C. and a pressure of 5 kgf/cm$^2$ (49×10$^4$ N/m$^2$) for 60 seconds. Subsequently, the PET film was removed by peeling, and UV irradiation was conducted at a dose of 2,000 mJ/cm$^2$ using a conveyor-type UV irradiation device (EYE GRANDAGE) manufactured by Eye Graphics K.K. The resulting product was then thermally cured at 170° C. for 30 minutes. For comparison, a sample was produced by thermal curing at 170° C. for 30 minutes without UV irradiation. The surface concave-convex gap on the surface of the insulation layer in each sample was measured with a laser interference-type surface shape measuring device (NT 3300 manufactured by Veeco). The results of measuring the concave-convex gap (average value obtained by three measurements) are shown in Table 2. The dielectric constant and the dielectric dissipation factor were measured according to IPC-TM 650 2.5.5.9 (23° C., measurement frequency 1 GHz). The samples used for measuring the dielectric constant and the dielectric dissipation factor were obtained by laminating the adhesive films of Examples 1 and 2 plural times with the vacuum laminator to a thickness of 1 mm, irradiating the laminates with ultraviolet light at a dose of 2,000 mJ/cm$^2$ using a conveyor-type UV irradiation device (EYE GRANDAGE) manufactured by Eye Graphics K.K., and thermally curing the resulting products at 180° C. for 90 minutes.

TABLE 2

|  | Concave-convex (μm) | | | |
| --- | --- | --- | --- | --- |
|  | UV irradiation | No UV irradiation | Dielectric constant | Dielectric dissipation factor |
| Example 1 | 2.2 | 4.1 | 2.9 | 0.006 |
| Example 2 | 1.6 | 3.7 | 3.0 | 0.009 |

From Table 2, it is seen that the insulation layer formed on the circuit substrate using the adhesive film and the process of the present invention is quite excellent in surface smoothness and also excellent in dielectric properties.

Example 4

A circuit substrate was produced from an FR4 double-copper-clad laminate having a copper foil thickness of 35 μm and a plate thickness of 0.2 mm, and the adhesive film obtained in Example 1 was vacuum-laminated thereon with a vacuum laminator fitted with a heat press under conditions of a temperature of 110° C., a pressure of 5 kgf/cm$^2$ (49×10$^4$ N/m$^2$), an atmospheric pressure of 5 mmHg (6.7 hPa), and a pressing time of 30 seconds. Subsequently, heat-pressing was conducted at a temperature of 110° C. and a pressure of 5 kgf/cm$^2$ (49×10$^4$ N/m$^2$) for 60 seconds to laminate the adhesive film on both surfaces of the circuit substrate. The PET film was then peeled, and UV irradiation was conducted at a dose of 2,000 mJ/cm$^2$ using a conveyor-type UV irradiation device (EYE GRANDAGE) manufactured by Eye Graphics K.K. Thermal curing was conducted at 170° C. for 30 minutes to form an insulation layer. The insulation layer was bored with a laser to form via holes. Thereafter, the surface of the insulation layer was roughened with an alkaline permanganate oxidizing agent, and subjected to electroless plating and electroplating to form a conductor layer. A circuit was then formed by a subtractive method to obtain a four-layer printed circuit board. Subsequently, an annealing treatment was conducted at 180° C. for 90 minutes. The peel strength of the conductor layer of the resulting four-layer printed circuit board was 0.7 kgf/cm. Incidentally, the peel strength was measured according to Japanese Industrial Standard (JIS) C 6481, and the conductor plating thickness was set at approximately 30 μm. The thus-obtained multilayer printed circuit board was soldered at 260° C. for 60 seconds, and the solder heat resistance was observed. Consequently, abnormalities such as delamination of the resin or peeling of the conductor was not found.

INDUSTRIAL APPLICABILITY

The resin composition containing the aromatic cyanate compound, when used to prepare a printed circuit board by the process of the present invention, provides excellent dielectric properties in the resulting insulation layer. Further, since the resin composition contains a radical-polymerizable resin and undergoes a photo-curing step and a thermal curing step, the flatness of the resulting insulation layer is also excellent. Thus, the process can advantageously be used for producing a printed circuit board, especially a multilayer printed circuit board, which requires the circuit formation with a fine pattern. The resin composition and the adhesive film of the present invention are advantageously used to prepare insulation layers for such printed circuit boards.

Obviously, numerous modifications and variations of the present invention are possible in light of the above teachings. It is therefore to be understood that, within the scope of the appended claims, the invention may be practiced otherwise than as specifically described herein.

All patents and other references mentioned above are incorporated in full herein by this reference, the same as if set forth at length.

The invention claimed is:

1. A process for producing a printed circuit board, comprising:
    (a) coating a resin composition on a circuit substrate, said resin composition comprising: (i) at least one aromatic cyanate compound having two or more cyanato groups in a molecule; and (ii) at least one radical-polymerizable resin, to obtain a resin composition layer;
    (b) photo-curing said resin composition layer, to obtain a photo-cured resin; and
    (c) thermally curing said photo-cured resin, to form an insulation layer,
    wherein said at least one radical-polymerizable resin comprises at least one selected from the group consisting of a vinylbenzyl compound, a vinylbenzyl ether compound, and mixtures thereof, and has a weight average molecular weight of from 1,500 to 50,000.

2. The process according to claim 1, wherein said resin composition further comprises at least one photo initiator.

3. The process according to claim 1, wherein said resin composition further comprises at least one epoxy resin.

4. The process according to claim 1, wherein said resin composition further comprises at least one phenoxy resin.

5. The process according to claim 1, wherein the resin composition further comprises at least one inorganic filler.

6. The process according to claim 4, wherein said at least one phenoxy resin has a weight average molecular weight of from 5,000 to 100,000.

7. The process according to claim 1, wherein said (a) coating said resin composition on said circuit substrate is conducted by laminating an adhesive film on said circuit substrate and said adhesive film comprises a layer of said resin composition formed on a support film.

8. The process according to claim 1, which further comprises:
    (d) forming a conductor layer on said insulation layer by plating.

9. A resin composition, comprising:
    (a) at least one aromatic cyanate compound having two or more cyanato groups in a molecule;
    (b) at least one compound selected from the group consisting of a vinylbenzyl compound, a vinylbenzyl ether compound, and mixtures thereof; and
    (c) at least one photopolymerization initiator,
    wherein said (b) at least one compound selected from the group consisting of a vinylbenzyl compound, a vinylbenzyl ether compound, and mixtures thereof has a weight average molecular weight of from 1,500 to 50,000.

10. The resin composition according to claim 9, which further comprises:
    (d) at least one epoxy resin.

11. The resin composition according to claim 9, which further comprises:
    (e) at least one phenoxy resin.

12. The resin composition according to claim 9, which further comprises:
    (f) at least one inorganic filler.

13. The resin composition according to claim 11, wherein said (e) at least one phenoxy resin has a weight average molecular weight of from 5,000 to 100,000.

14. The resin composition according to claim 9, wherein said (a) at least one aromatic cyanate compound having two or more cyanato groups in a molecule and said (b) at least one compound selected from the group consisting of a vinylbenzyl compound, a vinylbenzyl ether compound, and mixtures thereof are present in said resin composition in a weight ratio of from 1:9 to 9:1; and
    said (b) at least one compound selected from the group consisting of a vinylbenzyl compound, a vinylbenzyl ether compound, and mixtures thereof and said (c) at least one photopolymerization initiator are present in said resin composition in a weight ratio of from 100:0.5 to 100:15.

15. An adhesive film, comprising a layer of a resin composition according to claim 9 formed on a support substrate.

16. The adhesive film according to claim 15, wherein said resin composition further comprises:
    (d) at least one epoxy resin.

17. The adhesive film according to claim 15, wherein said resin composition further comprises:
    (e) at least one phenoxy resin.

18. The adhesive film according to claim 15, wherein said resin composition further comprises:
    (t) at least one inorganic filler.

19. The adhesive film according to claim 17, wherein said (e) at least one phenoxy resin has a weight average molecular weight of from 5,000 to 100,000.

20. The adhesive film according to claim 15, wherein said (a) at least one aromatic cyanate compound having two or more cyanato groups in a molecule and said (b) at least one compound selected from the group consisting of a vinylbenzyl compound, a vinylbenzyl ether compound, and mixtures thereof are present in said resin composition in a weight ratio of from 1:9 to 9:1; and
    said (b) at least one compound selected from the group consisting of a vinylbenzyl compound, a vinylbenzyl ether compound, and mixtures thereof and said (c) at least one photopolymerization initiator are present in said resin composition in a weight ratio of from 100:0.5 to 100:15.

21. A printed circuit board, which is prepared by a process comprising:
   (a) coating a resin composition on a circuit substrate, said resin composition comprising: (i) at least one aromatic cyanate compound having two or more cyanato groups in a molecule; and (ii) at least one radical-polymerizable resin, to obtain a resin composition layer;
   (b) photo-curing said resin composition layer, to obtain a photo-cured resin; and
   (c) thermally curing said photo-cured resin, to form an insulation layer,
   wherein said at least one radical-polymerizable resin comprises at least one selected from the group consisting of a vinylbenzyl compound, a vinylbenzyl ether compound, and mixtures thereof, and has a weight average molecular weight of from 1,500 to 50,000.

22. The printed circuit board according to claim 21, wherein said resin composition further comprises at least one photo initiator.

23. The printed circuit board according to claim 21, wherein said resin composition further comprises at least one epoxy resin.

24. The printed circuit board according to claim 21, wherein said resin composition further comprises at least one phenoxy resin.

25. The printed circuit board according to claim 21, wherein the resin composition further comprises at least one inorganic filler.

26. The printed circuit board according to claim 24, wherein said at least one phenoxy resin has a weight average molecular weight of from 5,000 to 100,000.

* * * * *